(12) United States Patent
Sforzin

(10) Patent No.: US 11,769,566 B2
(45) Date of Patent: Sep. 26, 2023

(54) PROGRAMMING CODEWORDS FOR ERROR CORRECTION OPERATIONS TO MEMORY

(71) Applicant: Micron Technology, Inc., Boise, ID (US)

(72) Inventor: Marco Sforzin, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 17/366,988

(22) Filed: Jul. 2, 2021

(65) Prior Publication Data

US 2023/0005563 A1 Jan. 5, 2023

(51) Int. Cl.
*G11C 29/42* (2006.01)
*G11C 29/18* (2006.01)
*G11C 16/26* (2006.01)
*H03K 19/21* (2006.01)
*G11C 16/10* (2006.01)

(52) U.S. Cl.
CPC ............ *G11C 29/42* (2013.01); *G11C 16/102* (2013.01); *G11C 16/26* (2013.01); *G11C 29/18* (2013.01); *H03K 19/21* (2013.01); *G11C 2029/1802* (2013.01)

(58) Field of Classification Search
CPC ...................................................... G11C 29/42
See application file for complete search history.

(56) References Cited

U.S. PATENT DOCUMENTS

| 10,366,747 | B2 | 7/2019 | Castro | |
|---|---|---|---|---|
| 10,395,738 | B2 | 8/2019 | Castro | |
| 2006/0090112 | A1* | 4/2006 | Cochran | G06F 12/084 |
| | | | | 711/E12.04 |
| 2006/0202232 | A1* | 9/2006 | Takami | G11C 7/24 |
| | | | | 257/209 |
| 2019/0189203 | A1* | 6/2019 | Redaelli | H01L 45/08 |
| 2019/0333598 | A1* | 10/2019 | Sasaki | G11C 29/56004 |
| 2021/0013903 | A1* | 1/2021 | Vanaparthy | H03M 13/1102 |

* cited by examiner

*Primary Examiner* — Douglas King
(74) *Attorney, Agent, or Firm* — Brooks, Cameron & Huebsch, PLLC

(57) ABSTRACT

The present disclosure includes apparatuses, methods, and systems for programming codewords for error correction operations to memory. An embodiment includes a memory having a plurality of groups of memory cells, wherein each respective one of the plurality of groups includes a plurality of sub-groups of memory cells, and circuitry configured to program a portion of a codeword for an error correction operation to one of the plurality of groups of memory cells by determining an address in that group of memory cells by performing an XOR operation on an address of one of the plurality of sub-groups of that group of memory cells, and programming the portion of the codeword to the determined address.

16 Claims, 7 Drawing Sheets

PROGRAMMING CODEWORDS FOR ERROR CORRECTION OPERATIONS TO MEMORY

TECHNICAL FIELD

The present disclosure relates generally to semiconductor memory and methods, and more particularly, to programming codewords for error correction operations to memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
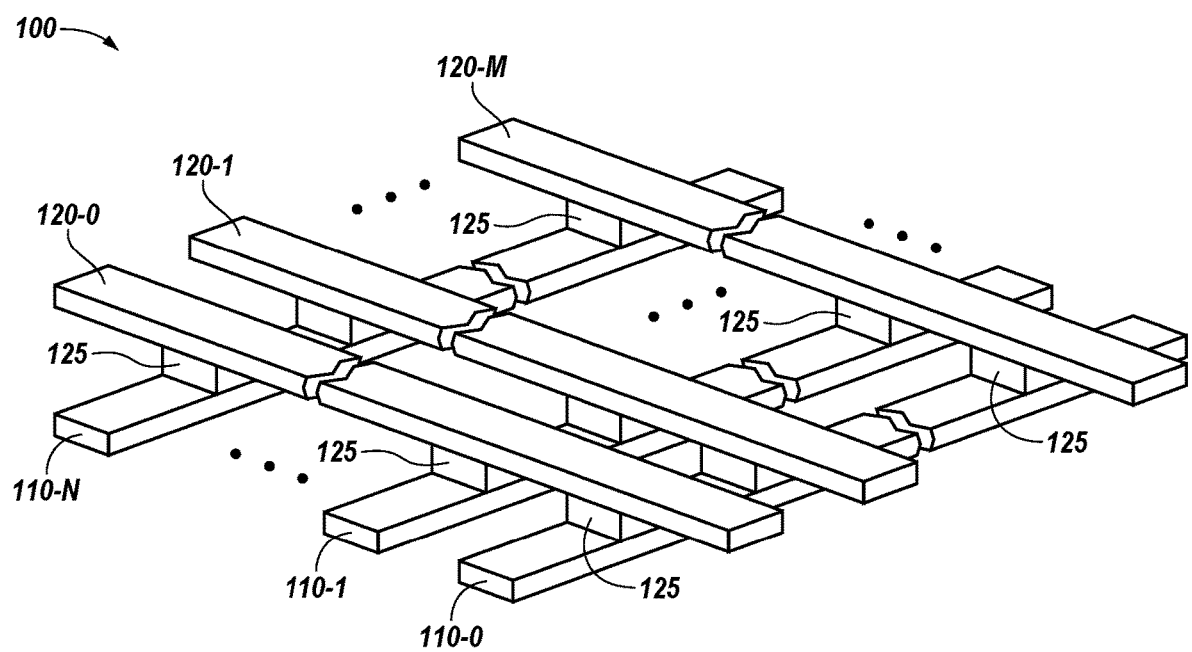
FIG. 1 is a three-dimensional view of an example of a memory array, in accordance with an embodiment of the present disclosure.

The present disclosure includes apparatuses, methods, and systems for programming codewords for error correction operations to memory. An embodiment includes a memory having a plurality of groups of memory cells, wherein each respective one of the plurality of groups includes a plurality of sub-groups of memory cells, and circuitry configured to program a portion of a codeword for an error correction operation to one of the plurality of groups of memory cells by determining an address in that group of memory cells by performing an XOR operation on an address of one of the plurality of sub-groups of that group of memory cells, and programming the portion of the codeword to the determined address.

During the sensing of a resistance variable memory cell, such as a self-selecting memory cell, a voltage may be applied to the memory cell, and the data state of the cell can be determined based on the amount of current that flows through the cell in response to the applied voltage. For example, when the voltage is applied to the memory cell, the resulting amount of current that is on a signal line (e.g., bit line or word line) to which the memory cell is coupled can be compared to a reference current, and the state of the memory cell can be determined based on the comparison. For instance, the cell can be determined to be in a first (e.g., reset) data state if the comparison indicates the signal line current is less than the reference current, and the cell can be determined to be in a second (e.g., set) data state if the comparison indicates the signal line current is greater than the reference current.

However, as such sense operations are performed on a memory cell during operation of the memory over time, various mechanisms, such as read disturb and/or current leakage, among others, can eventually cause the memory cell to be determined (e.g., sensed) to be in a different data state than the state to which the cell is actually programmed.

For instance, such mechanisms may cause a memory cell that is programmed to the first (e.g., reset) data state to be erroneously determined to be in the second (e.g., set) data state, and/or vice versa.

Error correction operations can be used to correct such errors occurring in data sensed from the memory. For instance, error correction operations can utilize codewords to perform error correction operations on erroneous data sensed from the memory. To increase the effectiveness (e.g., the correction rate and/or uniformity) of the error correction operations, different portions of the codewords may be stored in different portions of the memory, and at different distances from the row and column decoders of their respective memory portions (e.g., the memory cells used to store the different portions of the codewords may be located in different partitions of the memory, and at different electrical distances from their respective row and column decoders).

An address offset mechanism can be used to ensure different portions of the codewords are programmed to different portions of the memory at different electrical distances from their respective row and column decoders. In previous approaches, the address offset mechanism can be based on an addition modulo operation performed on the most significant bits of the address to which the codeword is being programmed. Such an address offset mechanism, however, can be complex and slow, which can reduce the throughput of the memory.

Embodiments of the present disclosure, in contrast, can utilize an XOR-based address offset mechanism, and/or an address offset mechanism operation performed on any of the bits (e.g. rather than the most significant bits) of the address to which the codeword is being programmed, to ensure different portions of the codeword are programmed to different portions of the memory at different electrical distances from their respective row and column decoders. Such address offset mechanisms can be simpler and faster than previous address offset mechanisms, which can increase the throughput of the memory as compared with previous address offset mechanisms.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
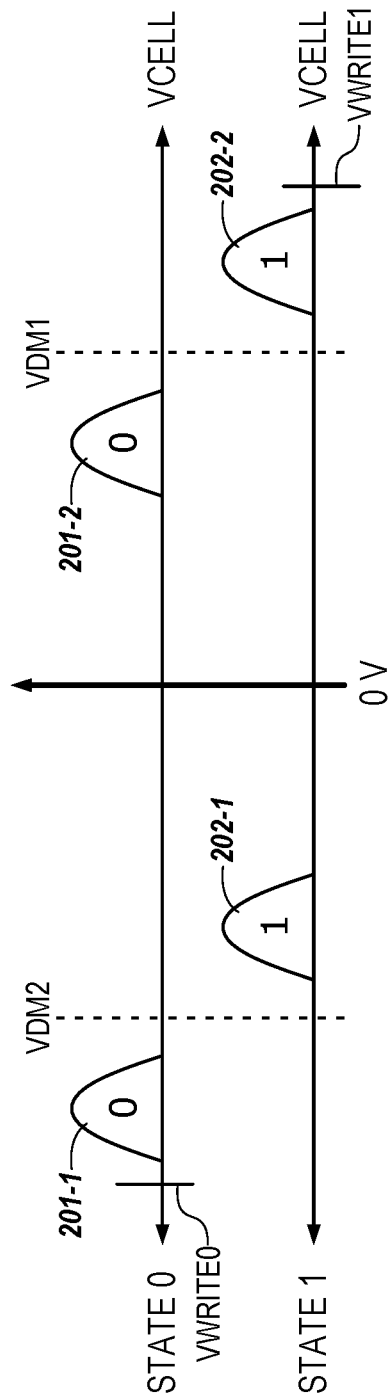
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
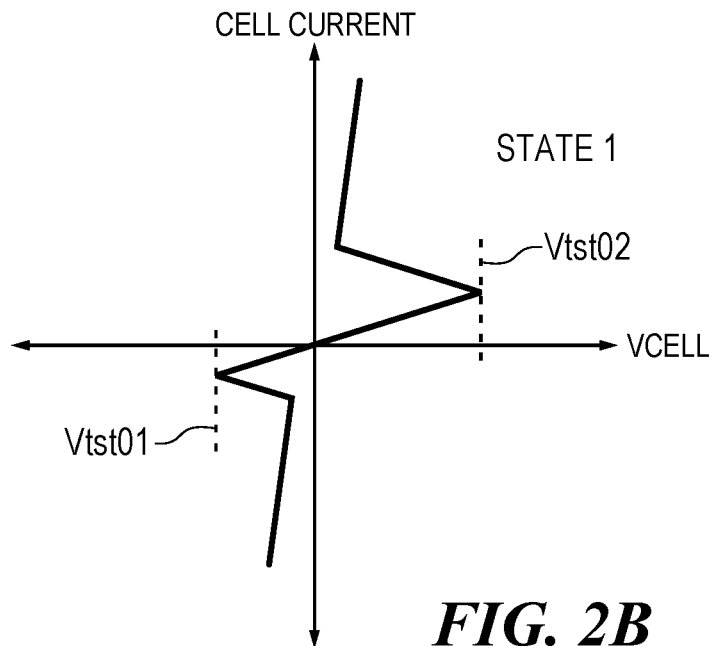
FIG. 2B is an example of a current-versus-voltage curve corresponding to a memory state of FIG. 2A, in accordance with an embodiment of the present disclosure.
Figure 2C:
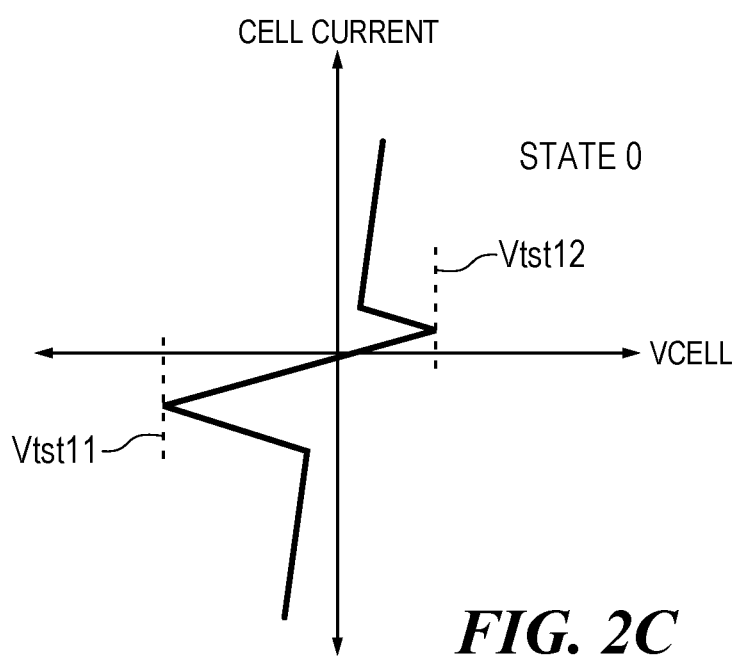
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 202-1 and 202-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

As memory cells 125 are repeatedly programmed (e.g., written) to different data states and repeatedly sensed (e.g., read), the magnitudes of their snapback voltages (e.g., Vtst 01, Vtst 02, Vtst11, and Vtst12) may change due to the stress caused by continuously applying the programming voltages and the demarcation voltages (e.g., VDM1 and VDM2) to the cells, which in turn may make it easier or more difficult for the cells to snap back. This change may cause the cell to be sensed to be in a different data state that the state to which the cell was actually programmed. For instance, a memory cell that is programmed to the reset state (e.g., state 0) may erroneously be sensed to be in the set state (e.g., state 1), and/or vice versa.

Error correction operations can be used to correct such errors occurring in data sensed from memory cells 125. For instance, error correction operations can utilize codewords to perform error correction operations on erroneous data sensed from the memory cells. As an example, an error correction operation can utilize redundant data bits in addition to information bits to generate a codeword (e.g., a codeword data pattern). Error correction can be performed on a received word to recover the original codeword, and the presence of redundant bits enables the original data bits to be recovered even if some number of the original or redundant bits have been corrupted.

To increase the effectiveness (e.g., the correction rate and/or uniformity) of the error correction operation, different portions of the codeword may be stored in different portions of the memory, and at different distances from the row and column decoders of their respective memory portions (e.g., the memory cells used to store the different portions of the codewords may be located in different partitions of the memory, and at different electrical distances from their respective row and column decoders). An address offset mechanism can be used to ensure different portions of the codeword are programmed to different portions of the memory at different electrical distances from their respective row and column decoders. For example, embodiments of the present disclosure can utilize an XOR-based address offset mechanism, and/or an address offset mechanism operation performed on any of the bits (e.g. rather than the most significant bits) of the address to which the codeword is being programmed, to ensure different portions of the codeword are programmed to different portions of the memory at different electrical distances from their respective row and column decoders, as will be further described herein.

Figure 3:
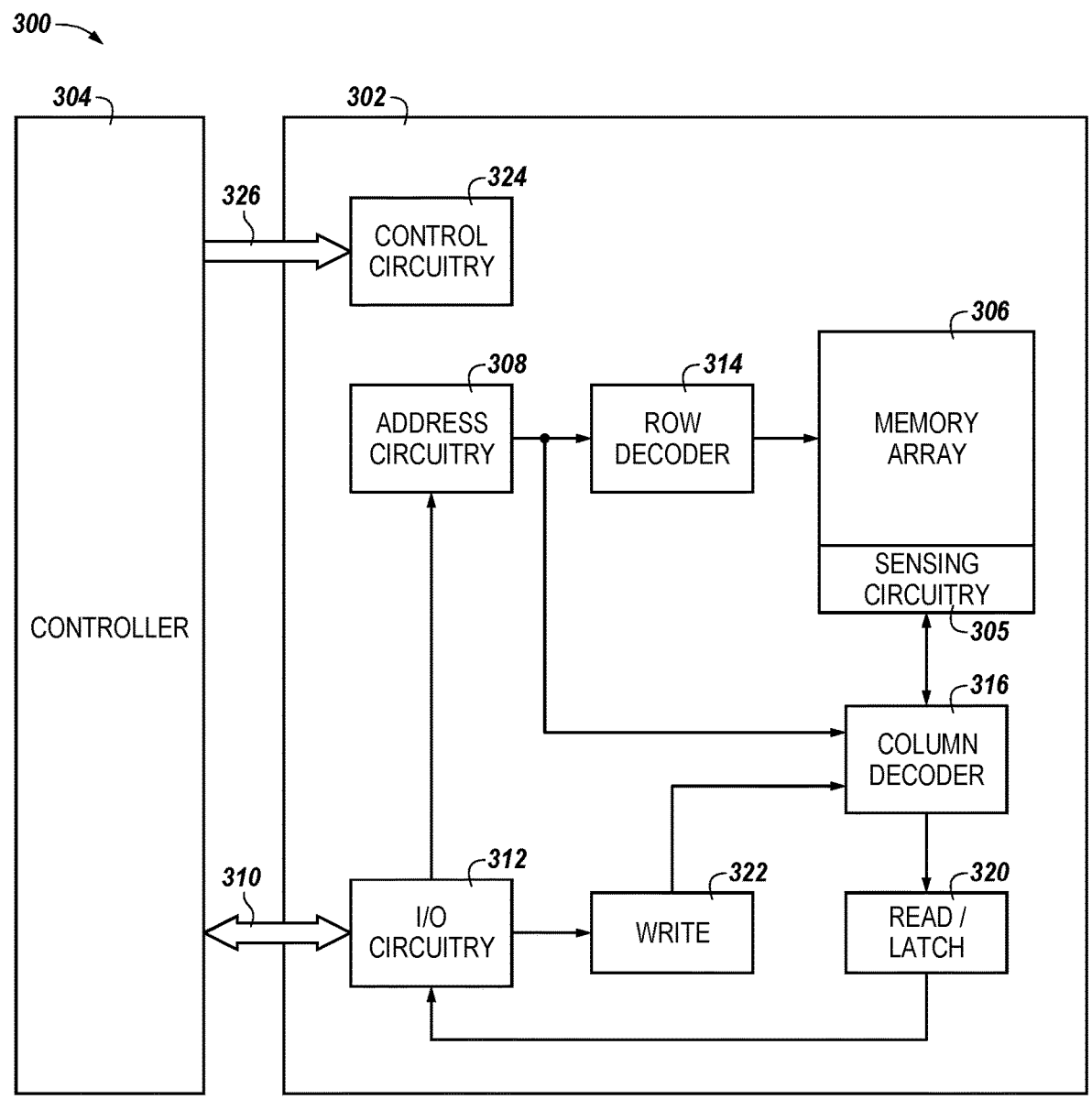
FIG. 3 is a block diagram illustration of an example apparatus, in accordance with an embodiment of the present disclosure.

FIG. 3 is a block diagram illustration of an example apparatus, such as an electronic memory system 300, in accordance with an embodiment of the present disclosure. Memory system 300 may include an apparatus, such as a memory device 302 and a controller 304, such as a memory controller (e.g., a host controller). Controller 304 might include a processor, for example. Controller 304 might be coupled to a host, for example, and may receive command signals (or commands), address signals (or addresses), and data signals (or data) from the host and may output data to the host.

Memory device 302 includes a memory array 306 of memory cells. For example, memory array 306 may include one or more of the memory arrays, such as a cross-point array, of memory cells disclosed herein. For instance, memory array 306 can include a plurality of groups (e.g., partitions) of memory cells, and each respective group can include a plurality of sub-groups (e.g., tiles) of memory cells, as will be further described herein (e.g., in connection with FIG. 5). As an example, memory array 306 can include 16 groups with 256 sub-groups in each respective group, or 32 groups with 128 sub-groups in each respective group. Further, memory array 306 can include crossing signal (e.g., word and bit) lines, and each of the sub-groups can include decks of memory cells located at the crossings, as will be further described herein (e.g., in connection with FIGS. 4A and 4B).

Memory device 302 may include address circuitry 308 to latch address signals provided over I/O connections 310 through I/O circuitry 312. Address signals may be received and decoded by a row decoder 314 and a column decoder 316 to access the memory array 306. For example, row decoder 314 and/or column decoder 316 may include drivers. Different memory cells of memory array 306 may have different electrical distances with respect to (e.g., be different electrical distances from) row decoder 314 and column decoder 316, as will be further described herein (e.g., in connection with FIG. 6). Further, although a single row decoder and a single column decoder are shown in FIG. 3, embodiments of the present disclosure are not so limited. For example, in embodiments in which memory array 306 includes 16 groups of memory cells, memory device 302 may include four row decoders and four column decoders. As an additional example, in embodiments in which memory array 306 includes 32 groups of memory cells, memory device 302 may include five row decoders and five column decoders.

Memory device 302 may sense (e.g., read) data in memory array 306 by sensing voltage and/or current changes in the memory array columns using sense/buffer circuitry that in some examples may include read/latch circuitry 320 and/or sensing circuitry 305. Read/latch circuitry 320 may read and latch data from the memory array 306. Sensing circuitry 305 may include a number of sense amplifiers coupled to memory cells of memory array 306, which may operate in combination with the read/latch circuitry 320 to sense (e.g., read) memory states from targeted memory cells. I/O circuitry 312 may be included for bi-directional data communication over the I/O connections 310 with controller 304. Write circuitry 322 may be included to write data to memory array 306.

In some embodiments, controller 304 can concurrently (e.g., simultaneously) program (e.g., write) data to a single memory cell of each respective sub-group of one of the plurality of groups of memory cells, and can concurrently sense (e.g., read) data stored in a single memory cell of each respective sub-group of one of the plurality of groups of memory cells (e.g., a single memory cell in each respective tile of a partition can be simultaneously read or written). Further, controller 304 can perform program operations on each of the plurality of groups of memory cells in parallel, and can perform sense operations on each of the plurality of groups of memory cells in parallel (e.g., read and write operations can be performed in a staggered parallelism through the partitions).

Control circuitry 324 may decode signals provided by control connections 326 from controller 304. These signals may include chip signals, write enable signals, and address latch signals that are used to control the operations on memory array 306, including data read and data write operations.

Control circuitry 324 may be included in controller 304, for example. Controller 304 may include other circuitry, firmware, software, or the like, whether alone or in combination. Controller 304 may be an external controller (e.g., in a separate die from the memory array 306, whether wholly or in part) or an internal controller (e.g., included in a same die as the memory array 306). For example, an internal controller might be a state machine or a memory sequencer.

In some examples, controller 304 can program codewords for error correction operations to memory array 306. For example, controller 304 can program different portions of the codeword to different portions of memory array 306, at different distances from row decoder 314 and column decoder 316, using an XOR-based address offset mechanism, and/or using an address offset mechanism operation performed on any of the bits (e.g. rather than the most significant bits) of the address to which the codeword is being programmed.

For example, controller 304 can program a different portion of a codeword for an error correction operation to each respective one of the plurality of groups of memory cells of memory array 306 by determining an address (e.g., a physical address) in each respective one of the plurality of groups of memory cells, and programming a different portion of the codeword to each respective determined address. For instance, controller 306 can program a first portion of the codeword to a first one of the plurality of groups of memory cells by determining an address in that group and programming the first portion of the codeword to the determined address in that group, a second portion of the codeword to a second one of the plurality of groups of memory cells by determining an address in that group and programming the second portion of the codeword to the determined address in that group, etc.

In an embodiment, the address in the group of memory cells can be determined by performing an XOR operation on an address (e.g., on the bits representing the row address and column address) of one of the plurality of sub-groups of that group of memory cells. The XOR operation can be performed on any portion (e.g., any subset) of the address of the sub-group. For example, any portion of the address can comprise a portion of the address that is not the most significant portion (e.g., that is not the most significant bits) of the address. That is, the XOR operation does not have to be performed on the most significant portion (e.g., the most significant bits) of the address.

For example, the address of the sub-group can include a first number of bits corresponding to the row of the sub-group in memory array 306 and a second number of bits corresponding to the column of the sub-group in memory array 306, and any portion of the address (e.g., the portion of the address on which the XOR operation is performed) can comprise a (e.g., one or more) bit of the first number of bits that is not a most significant bit of the first number of bits and a bit of the second number of bits that is not a most significant bit of the second number of bits. Further, any portion of the address can comprise less than all of the first number of bits and less than all of the second number of bits.

As an example, the first number of bits and the second number of bits can each comprise twelve bits, and the portion of the address can comprise five of the first number of bits and five of the second number of bits, with at least one of the respective five bits not being a most significant bit of the respective twelve bits.

Controller 306 can perform the XOR operation on the address of the sub-group (e.g., on the portion of the address) using a function of the group (e.g., partition) of memory cells in which the sub-group is included. The function can be, for instance, a shift rotate function.

As an example, the address in the group of memory cells can be given by:

$$x\sim[i_4i_3i_2i_1i_0]=x[i_4i_3i_2i_1i_0] \text{ XOR } \delta(P)$$

$$y\sim[i_4i_3i_2i_1i_0]=y[i_4i_3i_2i_1i_0] \text{ XOR } \delta(P)$$

where $x[i_4i_3i_2i_1i_0]$ is the subset of the bits corresponding to the row of the sub-group on which the XOR operation is performed, $y[i_4i_3i_2i_1i_0]$ is the subset of the bits corresponding to the column of the sub-group on which the XOR operation is performed, $\delta(P)$ is the function of the of the group (e.g., partition P) of memory cells in which the sub-group is included used to perform the XOR operation, $x\sim[i_4i_3i_2i_1i_0]$ is the subset of the bits corresponding to the determined row address in the group of memory cells, and $y\sim[i_4i_3i_2i_1i_0]$ is the subset of the bits corresponding to the determined column address in the group of memory cells. The function $\delta(P)$ can be given by:

$$\delta(P)=f(P)+f(R)$$

where $f(P)$ is the shift rotate function and $f(R)$ is a constant offset that may be dependent upon memory array 306.

In an additional embodiment, the address in the group of memory cells can be determined by performing an addition modulo operation on an address (e.g., on the bits representing the row address and column address) of one of the plurality of sub-groups of that group of memory cells. The addition modulo operation can be performed on any portion (e.g., any subset) of the address of the sub-group (e.g., a portion of the address that is not the most significant portion of the address), in a manner analogous to that previously described in connection with the XOR operation.

Controller 306 can perform the addition modulo operation on the address of the sub-group (e.g., on the portion of the address) using a function of the group (e.g., partition) of memory cells in which the sub-group is included. The function can be, for instance, a shift rotate function.

As an example, the address in the group of memory cells can be given by:

$$x\sim[i_4i_3i_2i_1i_0]=x[i_4i_3i_2i_1i_0]+\delta(P)\text{mod } N$$

$$y\sim[i_4i_3i_2i_1i_0]=y[i_4i_3i_2i_1i_0]+\delta(P)\text{mod } N$$

where $x[i_4i_3i_2i_1i_0]$ is the subset of the bits corresponding to the row of the sub-group on which the addition modulo operation is performed, $y[i_4i_3i_2i_1i_0]$ is the subset of the bits corresponding to the column of the sub-group on which the addition modulo operation is performed, $\delta(P)$ is the function of the of the group (e.g., partition P) of memory cells in which the sub-group is included used to perform the addition modulo operation, N is the number (e.g., quantity) of groups (e.g., partitions) of memory cells included in memory array 306, $x\sim[i_4i_3i_2i_1i_0]$ is the subset of the bits corresponding to the determined row address in the group of memory cells, and $y\sim[i_4i_3i_2i_1i_0]$ is the subset of the bits corresponding to the determined column address in the group of memory cells. The function $\delta(P)$ can be analogous to the function δ(P) previously described in connection with the XOR operation. Further, $x[i_4i_3i_2i_1i_0]$ can be any subset of the bits of the address corresponding to the row (e.g., bits that are not the most significant bits of the address), and $y[i_4i_3i_2i_1i_0]$ can be any subset of the bits of the address corresponding to the column (e.g., bits that are not the most significant bits of the address), as previously described herein.

Each respective determined address can have a different electrical distance with respect to (e.g., be a different electrical distance from) row decoder 314 and column decoder 316. For instance, the determined address in the first group of memory cells can have a first electrical distance with respect to row decoder 314 and column decoder 316, the determined address in the second group of memory cells can have a second electrical distance with respect to row decoder 314 and column decoder 316, etc. An example of such an electrical distance will be further described herein (e.g., in connection with FIG. 6).

Figure 4A:
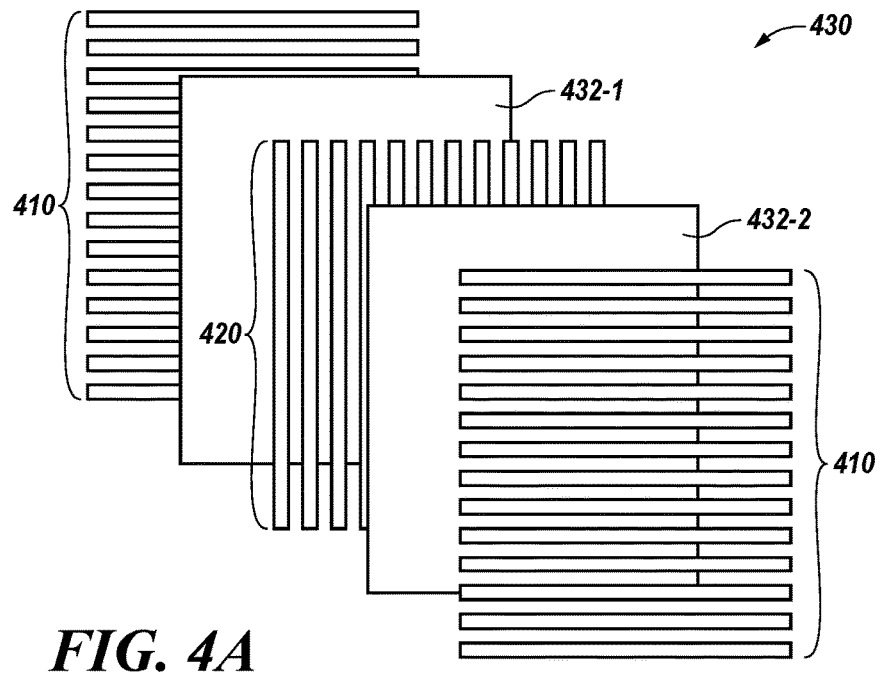
FIGS. 4A-4B are exploded three-dimensional views of examples of sub-groups of memory arrays, in accordance with an embodiment of the present disclosure.
Figure 4B:
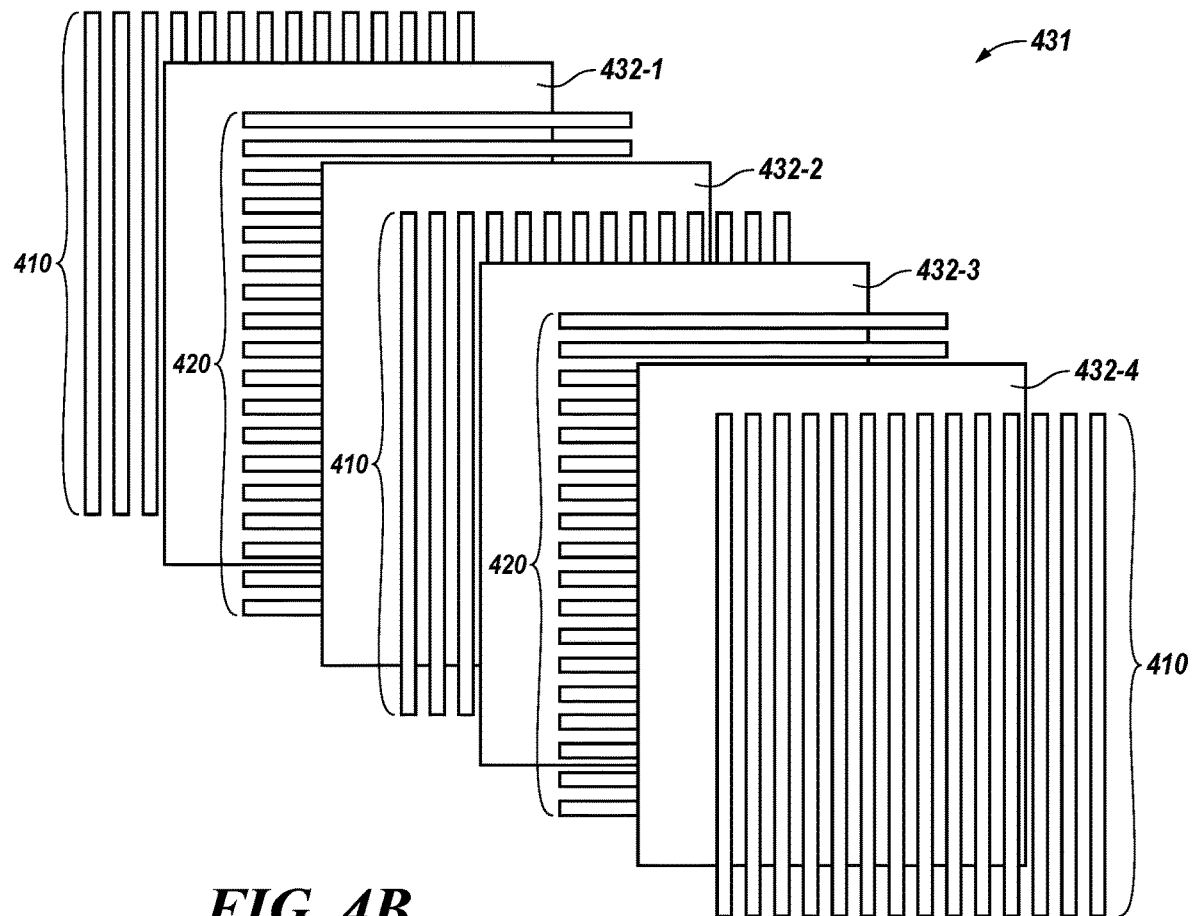

FIG. 4A is an exploded three-dimensional view of an example of a sub-group 430 of a memory array, in accordance with an embodiment of the present disclosure. FIG. 4B is an exploded three-dimensional view of an example of a sub-group 431 of a memory array, in accordance with an embodiment of the present disclosure. The memory arrays can be, for example, memory array 306 previously described in connection with FIG. 3, and sub-groups 430 and 431 can be tiles of their respective memory arrays, as previously described herein.

As shown in FIG. 4A, sub-group 430 includes a plurality of first signal lines (e.g., first word lines) 410, a plurality of second signal lines (e.g., second word lines) 410, and a plurality of third signal lines (e.g. bit lines) 420. As an example, sub-group 430 can include 4,096 first word lines 410, 4,096 second word lines 410, and 2,048 bit lines 420.

As shown in FIG. 4A, the plurality of bit lines 420 cross the plurality of first word lines 410 and the plurality of second word lines 410 (e.g., the plurality of bit lines 420 intersect with the plurality of first word lines 410 and the plurality of second word lines 410 in different planes). For example, each of the plurality of bit lines 420 may cross each of the plurality of first word lines 410 and each of the plurality of second word lines 410.

As shown in FIG. 4A, sub-group 430 includes a first deck 432-1 of memory cells and a second deck 432-2 of memory cells. The memory cells can be analogous to memory cells 125 previously described in connection with FIG. 1. For example, the memory cells of deck 432-1 can be located between bit lines 420 and first word lines 410 (e.g., at each respective crossing of bit lines 420 and first word lines 410), and the memory cells of deck 432-2 can be located between bit lines 420 and second word lines 410 (e.g., at each respective crossing of bit lines 420 and second word lines 410).

As shown in FIG. 4B, sub-group 431 includes a plurality of first signal lines (e.g., first word lines) 410, a plurality of second signal lines (e.g., second word lines) 410, and a plurality of third signal lines (e.g. first bit lines) 420. Sub-group 431 further includes a plurality of fourth signal lines (e.g., third word lines) 410, and a plurality of fifth signal lines (e.g., second bit lines) 420. As an example, sub-group 431 can include 4,096 first word lines 410, 4,096 second word lines 410, 4,096 third word lines 410, 4,096 first bit lines 420, and 4,096 second bit lines 420.

As shown in FIG. 4B, the plurality of first bit lines 420 cross the plurality of first word lines 410 and the plurality of second word lines 410 (e.g., the plurality of first bit lines 420 intersect with the plurality of first word lines 410 and the plurality of second word lines 410 in different planes). For example, each of the plurality of first bit lines 420 may cross each of the plurality of first word lines 410 and each of the plurality of second word lines 410. Further, the plurality of second bit lines 420 cross the plurality of second word lines 410 and the plurality of third word lines 410 (e.g., the plurality of second bit lines 420 intersect with the plurality of second word lines 410 and the plurality of third word lines 410 in different planes). For example, each of the plurality of second bit lines 420 may cross each of the plurality of second word lines 410 and each of the plurality of third word lines 410.

As shown in FIG. 4B, sub-group 431 includes a first deck 432-1 of memory cells, a second deck 432-2 of memory cells, a third deck 432-3 of memory cells, and a fourth deck 432-4 of memory cells. The memory cells can be analogous to memory cells 125 previously described in connection with FIG. 1. For example, the memory cells of deck 432-1 can be located between first bit lines 420 and first word lines 410 (e.g., at each respective crossing of first bit lines 420 and first word lines 410), and the memory cells of deck 432-2 can be located between first bit lines 420 and second word lines 410 (e.g., at each respective crossing of first bit lines 420 and second word lines 410). Further, the memory cells of deck 432-3 can be located between second bit lines 420 and second word lines 410 (e.g., at each respective crossing of second bit lines 420 and second word lines 410), and the memory cells of deck 432-4 can be located between second bit lines 420 and third word lines 410 (e.g., at each respective crossing of second bit lines 420 and third word lines 410).

Figure 5:
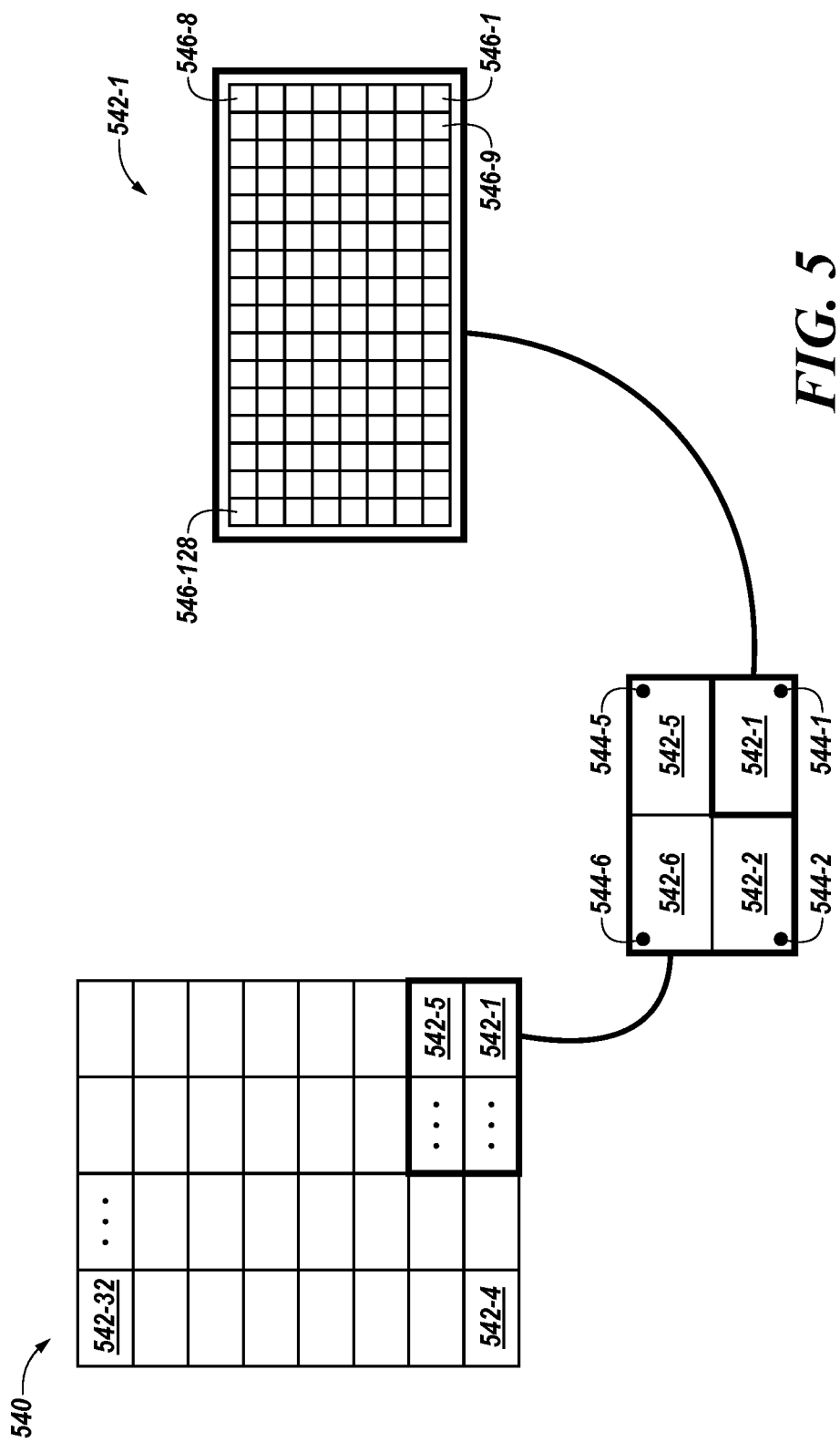
FIG. 5 is an illustration of an example organization of a memory array, in accordance with an embodiment of the present disclosure.

FIG. 5 is an illustration of an example organization of a memory array 540, in accordance with an embodiment of the present disclosure. Memory array 540 can be, for example, memory array 306 previously described in connection with FIG. 3.

As shown in FIG. 5, memory array 540 includes a plurality of groups (e.g., partitions) 542-1, . . . , 542-4, 542-5, . . . , 542-32 of memory cells, which may be collectively referred to herein as groups 542. In the example illustrated in FIG. 5, memory array 540 includes (e.g., in partitioned into) 32 groups of memory cells, arranged in eight rows and four columns.

A separate, enlarged view of four adjacent groups (e.g., groups 542-1, 542-2, 542-5, and 542-6) of the array 540 is also illustrated in FIG. 5. Four such adjacent groups of the array 540 can be referred to as a quad partition. For simplicity, only one such quad partition is illustrated in FIG. 5, but array 540 can include additional quad partitions in an analogous manner.

The position 544 of the word lines and/or bit lines in each of the four groups 542-1, 542-2, 542-5, and 542-6 of the quad partition is also shown in this enlarged view. For instance, the enlarged view illustrates the position 544-1 of the word lines and/or bit lines in group 542-1, the position 544-2 of the word lines and/or bit lines in group 542-2, the position 544-5 of the word lines and/or bit lines in group 542-5, and the position 544-6 of the word lines and/or bit lines in group 542-6. The word lines and/or bit lines can be positioned in opposite corners of each respective group of the four adjacent groups 542-1, 542-2, 542-5, and 542-6, as illustrated in the enlarged view.

Each respective one of the plurality of groups 542 of memory cells can include a plurality of sub-groups (e.g., tiles) of memory cells. For simplicity, the sub-groups of only one of the groups 542 of memory cells (e.g., group 542-1)

is illustrated in FIG. 5, but each of the plurality of groups 542 can include sub-groups in an analogous manner.

As shown in FIG. 5, group 542-1 includes a plurality of sub-groups (e.g., tiles) 546-1, . . . , 546-8, 546-9, . . . , 546-128 of memory cells, which may be collectively referred to herein as sub-groups 546. In the example illustrated in FIG. 5, group 542-1 includes (e.g., in partitioned into) 128 sub-groups of memory cells, arranged in eight rows and sixteen columns.

Figure 6:
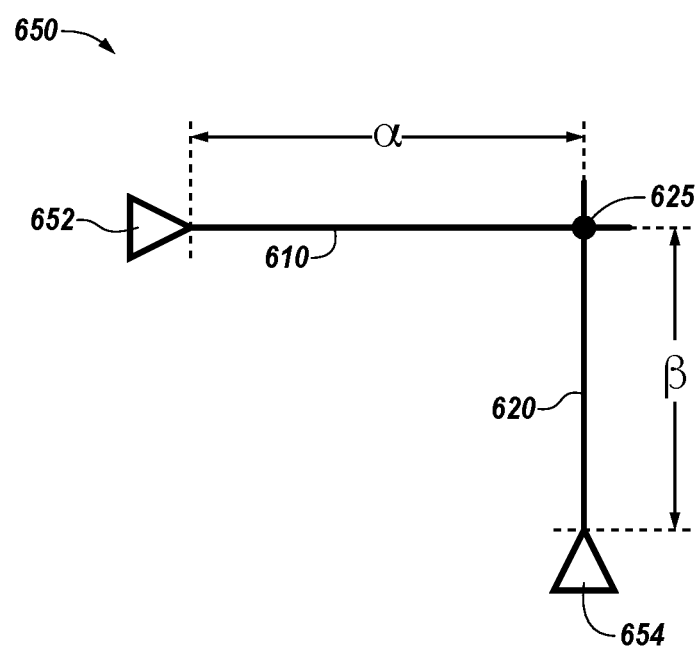
FIG. 6 is an illustration of an example electrical distance for a memory cell of a memory array, in accordance with an embodiment of the present disclosure.

FIG. 6 is an illustration of an example electrical distance for a memory cell 625 of a memory array 650, in accordance with an embodiment of the present disclosure. Memory cell 625 and memory array 650 can be analogous to the memory cells and memory arrays previously described herein.

As shown in FIG. 6, memory cell 625 can be coupled to signal lines 610 and 620 (e.g., word line 610 and bit line 620), in a manner analogous to that previously described herein. Further, word line 610 can be coupled to row decoder 652, and bit line 620 can be coupled to column decoder 654, as illustrated in FIG. 6. Row decoder 652 and column decoder 654 can be analogous to row decoder 314 and column decoder 316, respectively, previously described in connection with FIG. 3. For instance, row decoder 652 and column decoder 654 can receive and decode address signals to access memory cell 625, as previously described herein.

As shown in FIG. 6, memory cell 625 is located a distance $\alpha$ from row decoder 652, and a distance $\beta$ from column decoder 654. For instance, word line 610 has a length $\alpha$ between row decoder 652 and memory cell 625, and bit line 620 has a length $\beta$ between column decoder 654 and memory cell 625.

The electrical distance of memory cell 625 with respect to (e.g., from) row decoder 652 and column decoder 654 is a function of distances $\alpha$ and $\beta$ illustrated in FIG. 6. The electrical distance of memory cell 625 can also be dependent on the structure and/or deck of the sub-group of memory cells in which memory cell 625 is located. For example, if memory cell 625 is included in a sub-group having the structure previously described in connection with FIG. 4A, the electrical distance (ED) can be given by:

$$ED=\alpha+\beta$$

regardless of whether memory cell 625 is included in deck 432-1 or deck 432-2. As an additional example, if memory cell 625 is included in a sub-group having the structure previously described in connection with FIG. 4B, the electrical distance (ED) can be given by:

$$ED=2\alpha+\beta$$

if memory cell 625 is included in deck 432-1 or deck 432-4, and by:

$$ED=\alpha+\beta$$

if memory cell 625 is included in deck 432-2 or deck 432-3.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory having a plurality of groups of memory cells, wherein each respective one of the plurality of groups includes a plurality of sub-groups of memory cells; and
   circuitry configured to program a portion of a codeword for an error correction operation to one of the plurality of groups of memory cells by:
   determining an address in that group of memory cells by performing an XOR operation on any portion of an address of one of the plurality of sub-groups of that group of memory cells; and
   programming the portion of the codeword to the determined address.

2. The apparatus of claim 1, wherein the circuitry is configured to perform the XOR operation on any portion of the address of the one of the plurality of sub-groups using a function of that group of memory cells.

3. The apparatus of claim 2, wherein the function is a shift rotate function.

4. The apparatus of claim 1, wherein each of the of memory cells of the plurality of groups is a self-selecting memory cell in which a single material serves as a select element and a storage element.

5. The apparatus of claim 4, wherein the single material is a chalcogenide material.

6. A method of operating memory, comprising:
   programming a portion of a codeword for an error correction operation to one of a plurality of groups of memory cells of the memory by:
   determining an address in that group of memory cells by performing an XOR operation on any portion of an address of one of a plurality of sub-groups of memory cells of that group of memory cells; and
   programming the portion of the codeword to the determined address.

7. The method of claim 6, wherein the address of the one of the plurality of sub-groups includes:
   a first number of bits corresponding to a row of the sub-group; and
   a second number of bits corresponding to a column of the sub-group.

8. The method of claim 7, wherein any portion of the address of the one of the plurality of sub-groups comprises:
   a bit of the first number of bits that is not a most significant bit of the first number of bits; and
   a bit of the second number of bits that is not a most significant bit of the second number of bits.

9. The method of claim 7, wherein any portion of the address of the one of the plurality of sub-groups comprises:
- less than all of the first number of bits; and
- less than all of the second number of bits.

10. The method of claim 7, wherein any portion of the address of the one of the plurality of sub-groups comprises:
- five of the first number of bits; and
- five of the second number of bits.

11. An apparatus, comprising:
- a memory having a plurality of groups of memory cells, wherein each respective one of the plurality of groups includes a plurality of sub-groups of memory cells; and
- circuitry configured to program a different portion of a codeword for an error correction operation to each respective one of the plurality of groups of memory cells by:
  - determining an address in each respective one of the plurality of groups of memory cells by performing an XOR operation on an address of a sub-group of that respective group of memory cells; and
  - programming a different portion of the codeword to each respective determined address.

12. The apparatus of claim 11, wherein:
the memory includes:
- a plurality of first signal lines;
- a plurality of second signal lines; and
- a plurality of third signal lines that cross the plurality of first signal lines and the plurality of second signal lines; and each of the plurality of sub-groups includes a first deck of memory cells and a second deck of memory cells, wherein:
- the memory cells of the first deck are located at each respective crossing of the plurality of third signal lines and the plurality of first signal lines; and
- the memory cells of the second deck are located at each respective crossing of the plurality of third signal lines and the plurality of second signal lines.

13. The apparatus of claim 12, wherein:
the memory includes:
- a plurality of fourth signal lines; and
- a plurality of fifth signal lines that cross the plurality of second signal lines and the plurality of fourth signal lines; and each of the plurality of sub-groups includes a third deck of memory cells and a fourth deck of memory cells, wherein:
- the memory cells of the third deck are located at each respective crossing of the plurality of fifth signal lines and the plurality of second signal lines; and
- the memory cells of the fourth deck are located at each respective crossing of the plurality of fifth signal lines and the plurality of fourth signal lines.

14. The apparatus of claim 11, wherein the circuitry is configured to:
- concurrently program data to a single memory cell of each respective one of the plurality of sub-groups of one of the plurality of groups; and
- concurrently sense data stored in a single memory cell of each respective one of the plurality of sub-groups of one of the plurality of groups.

15. The apparatus of claim 11, wherein the circuitry is configured to:
- perform program operations on each of the plurality of groups of memory cells in parallel; and
- perform sense operations on each of the plurality of groups of memory cells in parallel.

16. The apparatus of claim 11, wherein each respective determined address has a different electrical distance with respect to a row decoder and a column decoder associated with that address.

* * * * *